(12) United States Patent (10) Patent No.: US 9,231,137 B1
Sharifi et al. (45) Date of Patent: Jan. 5, 2016

(54) INFRARED PHOTODETECTOR WITH RETICULATED CONTACT

(75) Inventors: Hasan Sharifi, Agoura Hills, CA (US); Terence J. De Lyon, Newbury Park, CA (US); Rajesh D. Rajavel, Oak Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 339 days.

(21) Appl. No.: 13/152,947

(22) Filed: Jun. 3, 2011

Related U.S. Application Data

(60) Provisional application No. 61/351,372, filed on Jun. 4, 2010, provisional application No. 61/351,368, filed on Jun. 4, 2010.

(51) Int. Cl.
*H01L 31/0232* (2014.01)
*H01L 31/0328* (2006.01)
*H01L 31/0224* (2006.01)

(52) U.S. Cl.
CPC ........ *H01L 31/0328* (2013.01); *H01L 31/0224* (2013.01)

(58) Field of Classification Search
CPC . H01L 31/0328; H01L 31/0224; H01L 31/00; H01L 31/022408
USPC .................. 257/184–189, 431, 432, 441, 442
See application file for complete search history.

(56) References Cited

U.S. PATENT DOCUMENTS

| | | | |
|---|---|---|---|
| 7,652,252 B1 | 1/2010 | Rajavel et al. | |
| 7,687,871 B2 | 3/2010 | Maimon | |
| 7,755,023 B1 | 7/2010 | Rajavel et al. | |
| 7,800,067 B1 | 9/2010 | Rajavel et al. | |
| 8,502,271 B2 * | 8/2013 | Scott | 257/188 |
| 2005/0082520 A1 * | 4/2005 | Fathimulla et al. | 257/14 |
| 2010/0072514 A1 * | 3/2010 | Ting et al. | 257/184 |
| 2011/0037097 A1 | 2/2011 | Scott et al. | |
| 2011/0089514 A1 * | 4/2011 | Tay | 257/432 |

OTHER PUBLICATIONS

S. Maimon and G. W. Wicks, "nBn detector, an infrared detector with reduced dark current and higher operating temperature", Applied Physics Letters, vol. 89, 151109, 2006.

* cited by examiner

*Primary Examiner* — Laura Menz
*Assistant Examiner* — Candice Y Chan
(74) *Attorney, Agent, or Firm* — George R. Rapacki; Albert T. Wu

(57) ABSTRACT

Using a highly doped Cap layer of the same composition as the Contact material in an nBn or pBp infrared photodetector allows engineering of the energy band diagram to facilitate minority carrier current flow in the contact region and block minority current flow outside the Contact region. The heavily doped Cap layer is disposed on the Barrier between the Contacts but electrically isolated from the Contact material.

18 Claims, 6 Drawing Sheets

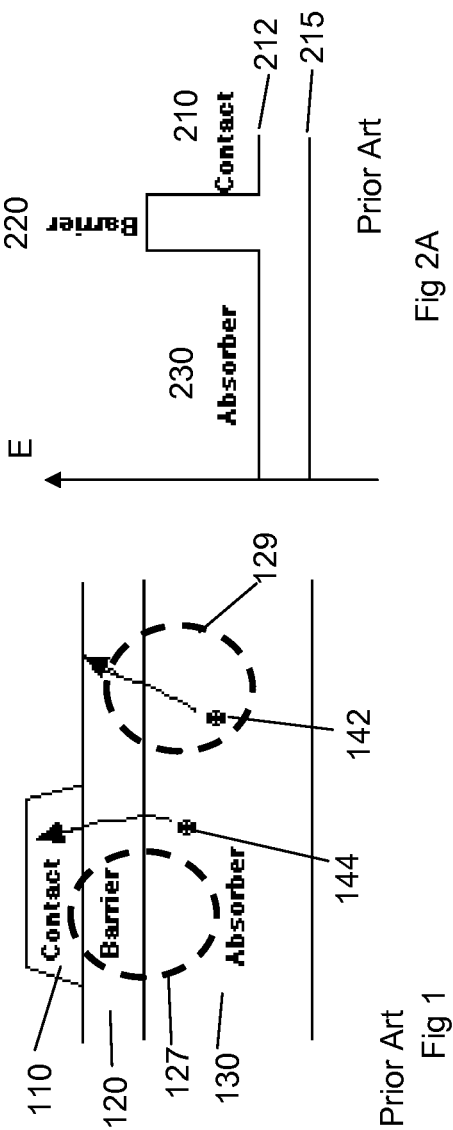
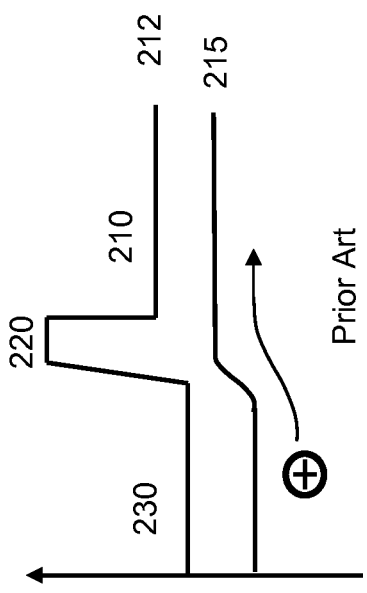
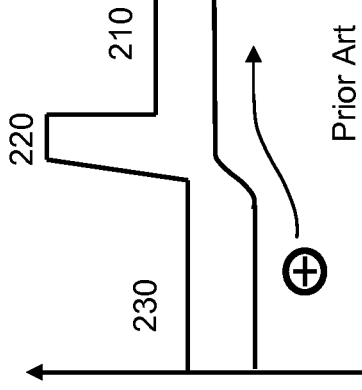
Fig 1 Prior Art
Fig 2A Prior Art
Fig 2B Prior Art

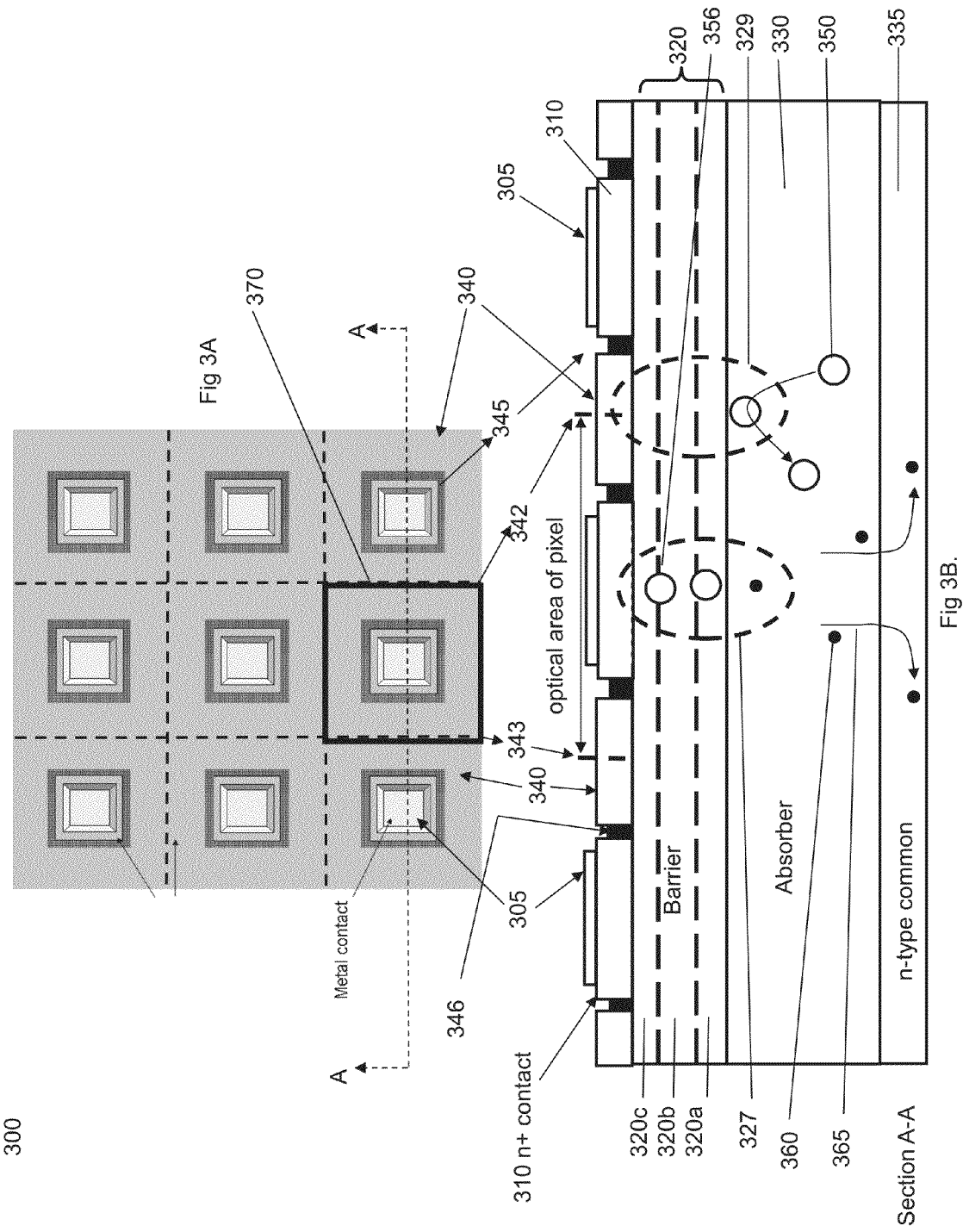

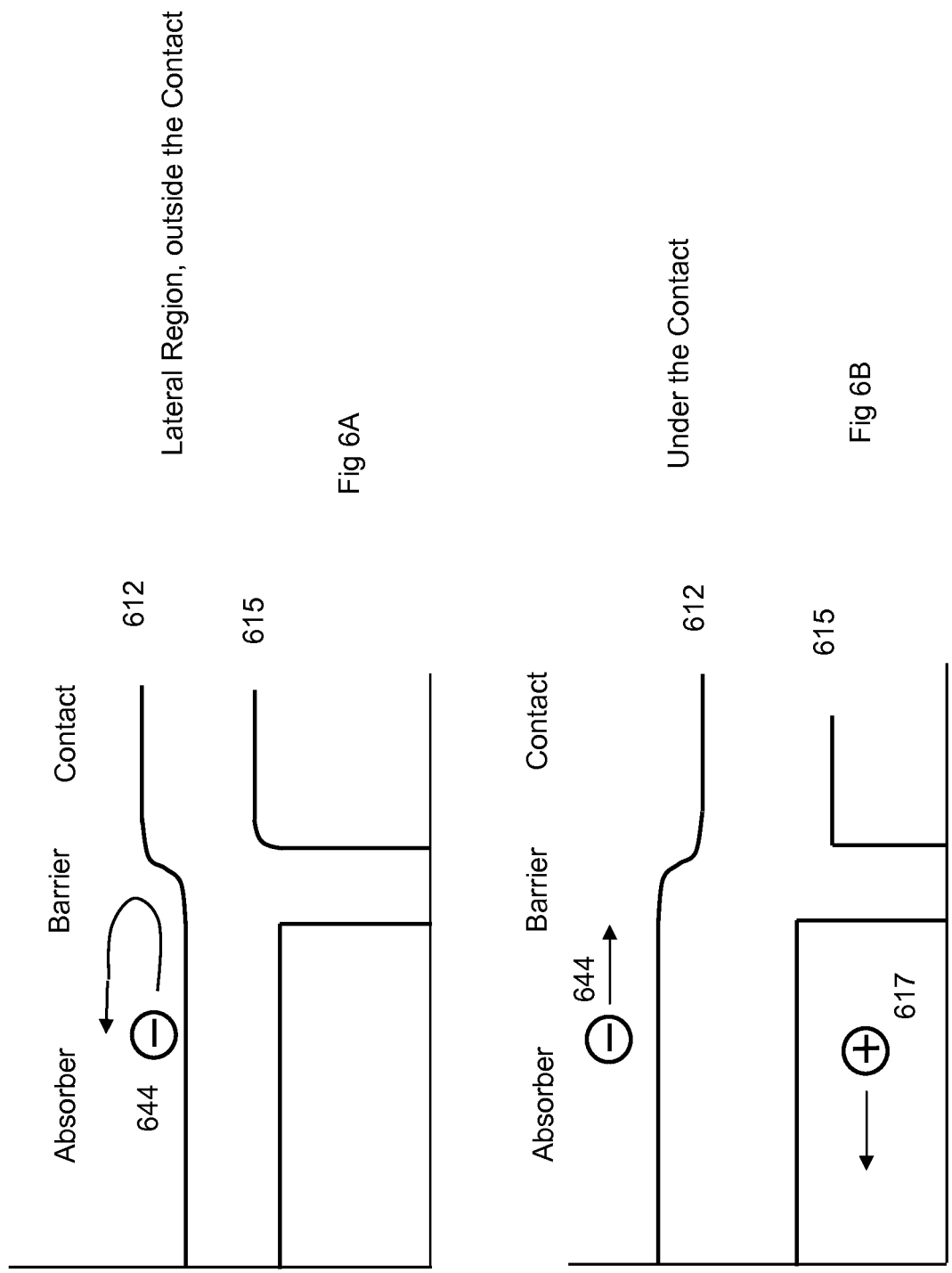

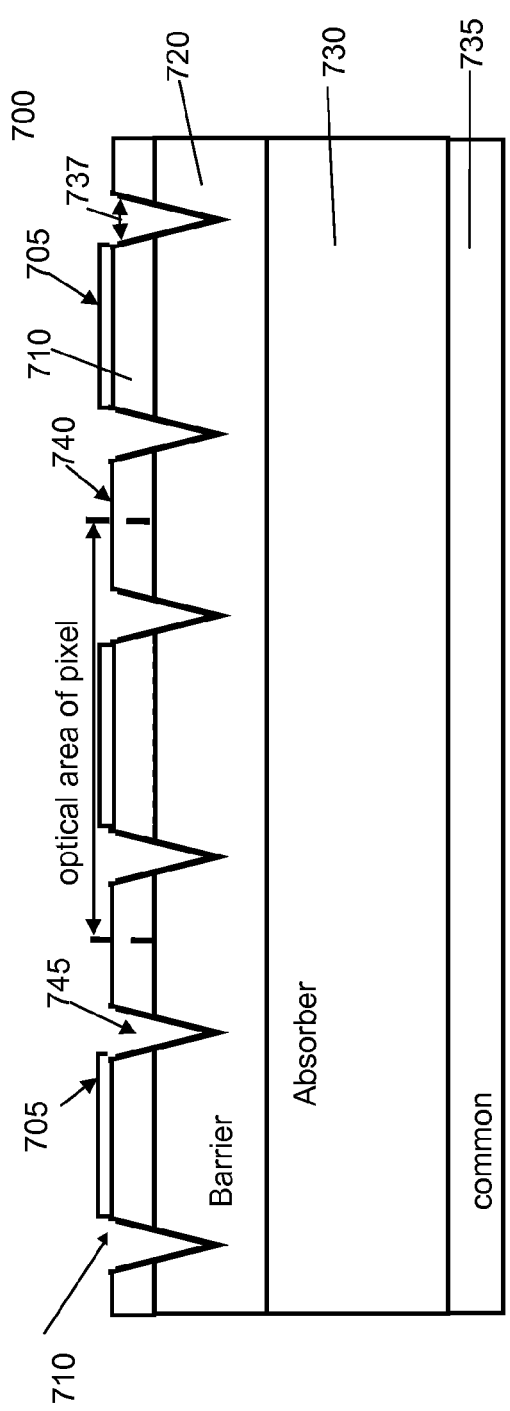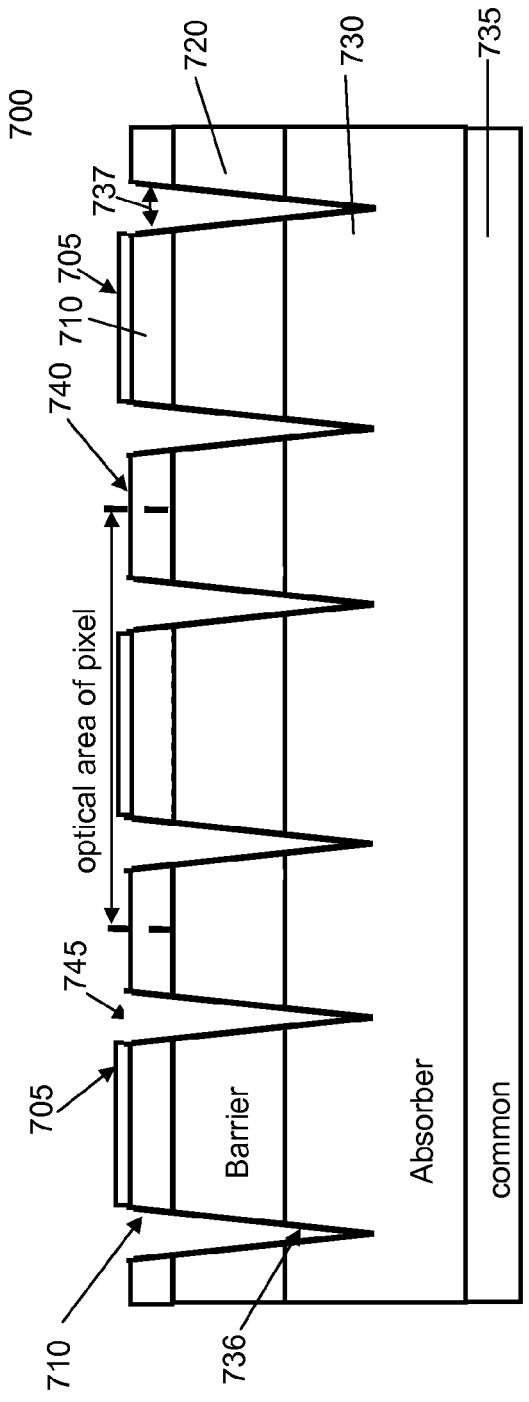

INFRARED PHOTODETECTOR WITH RETICULATED CONTACT

This application claims priority to provisional application 61/351,368 filed Jun. 4, 2010 titled "Compound Barrier Infrared Photodetector". Provisional application 61/351,368 is incorporated by reference herein. This application claims priority to provisional application 61/351,372 filed Jun. 4, 2010 titled "Electrostatic Barrier Infrared Photodetector" and incorporated by reference herein.

STATEMENT REGARDING FEDERALLY SPONSORED RESEARCH OR DEVELOPMENT

This invention was made with support from the United States Government under Contract No. S9 004726 awarded by U.S. Government. The Government has certain rights in the invention.

FIELD OF THE INVENTION

This invention relates to an apparatus and method for improving the sensitivity of an infrared photodetector while also reducing the dark current.

BACKGROUND OF THE INVENTION

Typical designs for an infrared photodetector for a focal plane array comprise a "Barrier" layer of constant alloy composition, whose composition is specifically chosen to guarantee a near-zero valence-band offset in order to obtain high-efficiency collection of photogenerated minority carriers. The prior-art devices are optimized for high-efficiency collection of photogenerated charge in the bulk of the device, but fail to provide mechanisms to minimize the effects of surface recombination/generation in the periphery outside the influence of the semiconductor contact. This is especially critical for devices utilizing small (<25 μm) pixels with reduced junction areas in practical focal-plane arrays. The effect of the surface recombination/generation in the periphery shows up in the dark current.

SUMMARY OF THE INVENTION

The principles of the present invention are embodied in an infrared photodetector with a reduced dark current, comprising: an absorber layer of a first area and comprising a first semiconductor, a barrier layer of the first area and comprising a second semiconductor disposed on the absorber area, a contact layer with a second area and comprising a third semiconductor disposed on the barrier layer, and a cap layer comprising the third semiconductor disposed on the barrier layer with an area approximately equal to the first area less the second area. The first semiconductor, the second semiconductor and the third semiconductor may comprise an alloy of two or more materials selected from the group consisting of Indium, Nitrogen, Phosphorous, Arsenic, Aluminum, Gallium and Antimony and combinations thereof; and wherein the first semiconductor, the second semiconductor and the third semiconductor may be doped with one or more elements selected from the group consisting of Beryllium, Carbon, Germanium, Selenium, Silicon, Sulfur, Tellurium, and Zinc. In an alternative embodiment, the first semiconductor may comprise InAsSb, the second semiconductor may comprise AlAsSb and the third semiconductor may comprise InAsSb. In alternative embodiment, the first semiconductor may comprise InAsSb, the second semiconductor may comprise AlInAsSb and the third semiconductor may comprise InAsSb. The contact layer may be separated from the cap layer by less than 3 microns, the contact layer may be separated from the cap layer by greater than 3 microns. Furthermore, the space between the contact layer and the cap layer may be filled with an electrically insulating material. In an alternative embodiment, the contact layer thickness is such that transport is precluded under a reasonable bias voltage where the reasonable bias voltage is any voltage less than that needed to electrically breakdown the barrier layer. In an alternative embodiment, the cap layer thickness may be substantially equal to a contact layer thickness and wherein the contact layer thickness is between 50 nm and 500 nm.

In an alternative embodiment, the barrier layer may comprise a first sublayer, a second sublayer and a third sublayer, wherein the first sublayer substantially comprises $Al_{0.3}In_{0.7}As_{0.7}Sb_{0.3}$ and is disposed on the absorber layer, wherein the second sublayer is disposed on the first sublayer, wherein the third sublayer substantially comprises $Al_{0.7}In_{0.3}As_{0.4}Sb_{0.6}$ and is disposed on the second sublayer.

Another embodiment of the principles of the present invention is a photodetector with a reduced dark current, comprising: an absorber layer comprising a first semiconductor, a barrier layer comprising a second semiconductor disposed on the absorber area, a contact layer comprising a third semiconductor disposed on a region of the barrier layer, and a cap layer comprising the third semiconductor disposed on the barrier layer wherein the contact layer is spaced apart from the cap layer by one hundred nanometers to three microns. The previous embodiment wherein the first semiconductor, the second semiconductor and the third semiconductor comprise an alloy of two or more materials selected from the group consisting of Indium, Nitrogen, Phosphorous, Arsenic, Aluminum, Gallium and Antimony and combinations thereof, and wherein the first semiconductor, the second semiconductor and the third semiconductor may be doped with one or more elements selected from the group consisting of Beryllium, Carbon, Germanium, Selenium, Silicon, Sulfur, Tellurium, and Zinc.

The previous embodiment wherein the first semiconductor comprises InAsSb, the second semiconductor comprises AlAsSb and the third semiconductor comprises InAsSb. In an alternative embodiment, the first semiconductor may comprise InAsSb, the second semiconductor may comprise AlInAsSb and the third semiconductor may comprise InAsSb. Furthermore, a previous embodiment may comprise a reticulated contact layer, the barrier layer may be reticulated, the contact layer may be electrically isolated from the cap layer by a dielectric, and the contact layer thickness is such that transport is precluded under a reasonable bias voltage wherein the reasonable bias voltage is any voltage less than that needed to electrically breakdown the barrier layer, or the contact layer or the absorber layer.

In an alternative embodiment, the cap layer thickness may be substantially equal to a contact layer thickness and the contact layer thickness may be between 50 nm and 500 nm. The barrier layer may comprise a first sublayer, a second sublayer and a third sublayer, the first sublayer may comprise $Al_{0.3}In_{0.7}As_{0.7}Sb_{0.3}$ and may be disposed on the absorber layer, the second sublayer may be disposed on the first sublayer, wherein the third sublayer may comprise $Al_{0.7}In_{0.3}As_{0.4}Sb_{0.6}$ and may be disposed on the second sublayer.

A further embodiment may comprise a plurality of photodetectors with a reduced dark current further comprising: an absorber layer comprising a first semiconductor, a barrier layer comprising a second semiconductor disposed on the absorber area, a contact layer comprising a third semiconductor disposed on a region of the barrier layer; and a cap layer comprising the third semiconductor disposed on the barrier layer wherein the contact layer and cap layer are reticulated by gaps between one to three microns.

BRIEF DESCRIPTION OF THE DRAWINGS

The accompanying drawings, together with the specification, illustrate exemplary embodiments of the principles of the invention, and, together with the description, serve to explain the principles of the invention. The accompanying drawings use the same last two digits for the reference numbers of the same components. Hence absorber layer 730 in FIG. 7 is the same as absorber layer 330 in FIG. 3B.

FIG. 1 shows the structure of a prior art infrared photodetector element of a focal plane array.

FIG. 2A shows the energy band diagram of the structure in FIG. 1 at zero bias.

FIG. 2B shows the energy band diagram of the structure in FIG. 1 at a reverse (negative) bias on the contact relative to the absorber.

FIG. 3A shows a top view of the focal plane array of infrared photodetectors according to the principles of the present invention and section line A-A.

FIG. 3B shows the structure of the focal plane array of FIG. 3A along section line A-A with an emphasis on an individual infrared photo detector.

FIG. 6A shows the energy band diagram for pBp photodetectors comprising the focal plane array under zero bias, ie outside the contact region.

FIG. 6B shows the energy band diagram for pBp infrared photodetectors under the contact and with the contact biased.

FIG. 7A Shows a detector architecture where etching past the barrier is not needed to define pixels.

FIG. 7B Shows a detector structure where the barrier is fully reticulated and the Absorber layer can be either fully or partially (partial Absorber layer reticulation shown) reticulated to define pixels.

DETAILED DESCRIPTION

Figure 4:
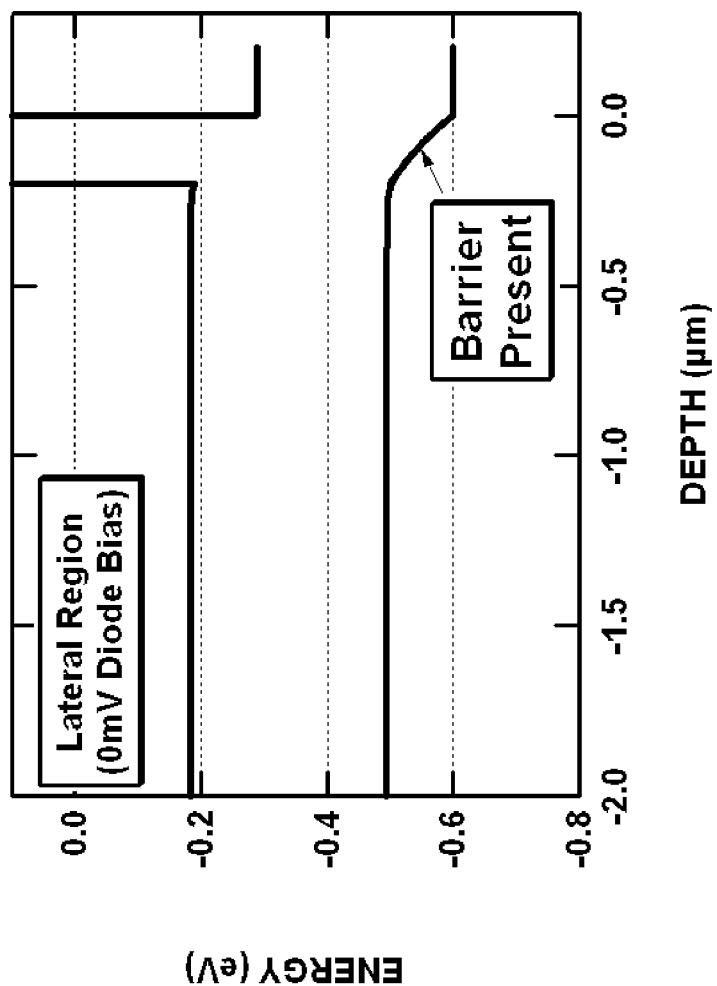
FIG. 4 shows the energy band diagram for nBn photodetectors of FIGS. 3A and 3B comprising the focal plane array under zero bias.

The following papers are incorporated by reference as though fully set forth herein: U.S. Pat. No. 7,687,871 Reduced Dark Current Photodetector by Shimon Maimon, issued 30 Mar. 2010; U.S. Pat. No. 7,652,252 titled "Electronically Tunable and Reconfigurable Hyperspectral Photon Detector", by Rajavel et. al. issued 26 January, 2010.

In the following detailed description, only certain exemplary embodiments of the principles of the present invention are shown and described, by way of illustration. As those skilled in the art would recognize, the described exemplary embodiments may be modified in various ways, all without departing from the spirit or scope of the principles of the present invention. Accordingly, the drawings and description are to be regarded as illustrative in nature, and not restrictive.

In general, prior art devices are not designed to ensure depletion-free, flat-band conditions in the Absorber layer. In order to ensure flat-band conditions in the Absorber layer, a compound Barrier has to be incorporated such that the field in the Absorber layer can be tailored by adjusting the doping in the Barrier layer located adjacent the Absorber layer. The problems described in the background section are at least partially solved by using a highly doped Contact layer structure such that the valence band will block the migration of minority carriers in the absence of bias and not block the migration of minority carriers when a bias is applied. The structure embodying principles of the present invention may use a Barrier structure comprising one or multiple layers, chosen to present a non-zero valence band energy barrier so as to suppress dark current and minority carrier recombination in peripheral regions of the device. The principles of the present invention are applicable to infrared photodetectors based on wide band gap materials such as AlAsSb and on narrow band gap materials such as InAsSb. By way of example and not limitation, the embodiments of the principles of the present invention are suitable for detecting light at wavelengths between 0.5 micron and 20 microns. Other wavelengths may be detected by choosing suitable materials.

Prior-art designs of wide bandgap "nBn" photodetectors are based on a structure that is summarized in FIG. 1. The device consists of three distinct layers: an "Absorber" layer 130 in which photogeneration of minority carriers occurs due to absorption of incoming photons, a "Barrier" layer 120 that blocks the flow of majority carriers, and a "Contact" layer 110 that facilitates recombination of minority carriers and connection to a metal Contact layer to complete an external circuit. Typical materials for the contact, barrier and absorber layers are InAsSb, AlAsSb and InAsSb respectively.

Prior art nBn infrared photodetector devices use the same materials for the Absorber layer and the Contact layer but a different material for the n Barrier layer. Part of the difference in the layers is in the doping. For nBn infrared photodetectors the Contact and Absorber layers are doped N type. The primary characteristic to this design is that the combination of materials for the Absorber layer 130 and Barrier layer 120 are specifically chosen to provide a flat valence band (215 in FIG. 2A) that offers no Barrier to minority carrier transport. A typical semiconducting material combination that meets this requirement, for example, is $InAs_{0.91}Sb_{0.09}/AlAs_{0.09}Sb_{0.91}$ (Absorber/Barrier). This design, while presenting no barrier to minority carrier transport from Absorber layer 130 to Contact layer 110 (in the region 127 under the Contact 110 mesa) also does not prevent minority carrier transport to the free surface of the exposed Barrier layer 120 outside the Contact 110 region, that is in the region 129. This lack of a barrier not only allows for recombination of bulk-generated minority carriers, but also does not prevent transport of surface generated minority carriers into the Absorber layer 130, which could result in excess dark current.

FIG. 2A shows the energy band gap of the prior art device without biasing of the Contact layer 110 relative to the Absorber layer 130. As mentioned above, the valence band 215 under the Contact layer 110 is flat. This is also the valence band present in peripheral regions outside the Contact layer 110 because the Barrier layer 120 is a semiconductor. FIG. 2B shows the energy band gap under the Contact layer 110 when the Contact layer 110 is reverse biased relative to the Absorber layer. The valence band 215 presents no obstacle to minority carrier transport.

In the photodetector 370 shown in FIG. 3B, the Contact layer 310 is highly doped. As important, the lateral space between Contacts layers 310 is filled with a Cap layer 340 the same composition as that of the Contact layer 310 material, with the same doping. However, this Cap layer 340 is electrically isolated from the Contact layer 310. In one embodiment, the Contact layer 310 is formed concurrently with the Cap layer 340 but segregated from the Cap layer 340. The segregation of the Contact layer 310 from the Cap layer 340 may be performed by etching or other techniques known to those in the art. This segregation of the Contact layer 310 from the Cap layer 340 forms a reticulated Contact layer 310. Generally, reticulated means characterized by or having the form of a grid or network. In this context, no implication is made that the grid is necessarily rectangular or regular. The photodetector array 300 may comprise photodetectors 370 of various shapes and sizes. The Cap layer 340 may have an irregular shape and size. In one aspect of the principles of this invention, the ratio of volume of the contact layer 310 under the Contact 305 to the volume of the Contact layer 310 plus Cap layer 340 and any removed material to reticulate the device, defines a fill factor of the photodetector and may be constant for a photodetector array 300 or vary for individual photodetectors 370.

FIG. 4 shows the energy band diagram under the Contact layer 310 with zero bias. This same diagram applies in the lateral region 329, under the Cap layer 340, outside the Contact layer 310 when the Contact 310 is reverse biased. This is because the highly doped Cap layer 340 alters the valence band to create a barrier to minority carrier migration in the regions outside the Contact layer 310.

Figure 5:
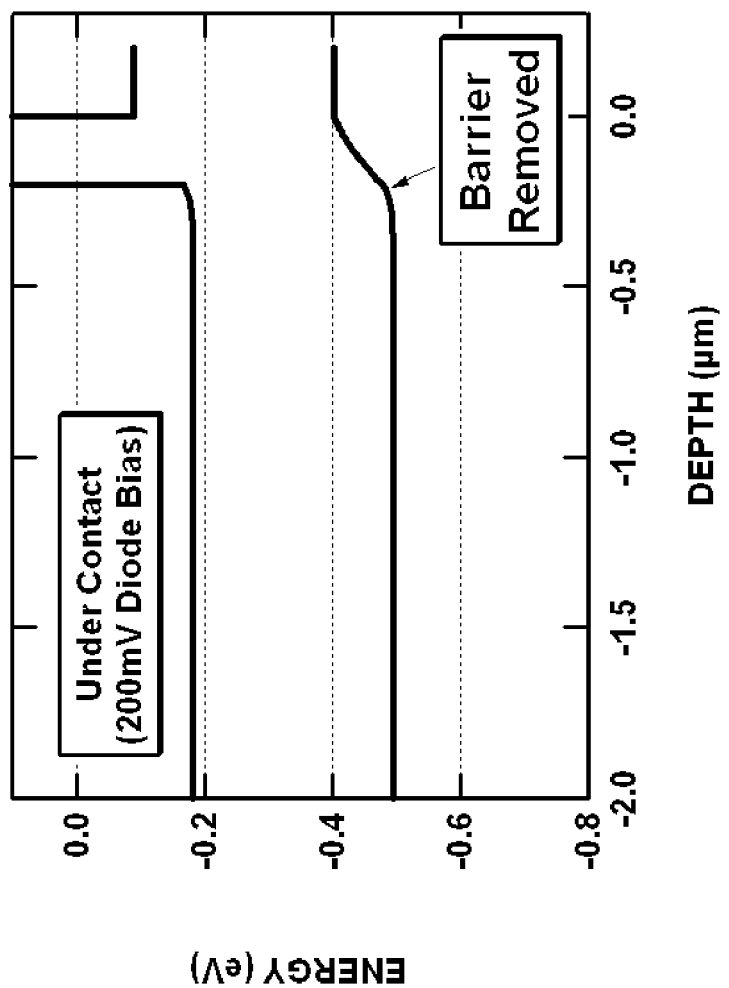
FIG. 5 shows the energy band diagram for nBn infrared photodetectors of FIGS. 3A and 3B under the contact and with the contact reverse biased.

In operation, as shown in FIG. 5, when Contact layer 310 is reverse biased (for nBn devices) the barrier to minority carrier migration is removed as seen in the upsweep of the valence band in FIG. 5. In the region 327 of the photodetector 370 under the Contact 310, a reasonable reverse bias that is applied to the photodetector 370 under normal operating conditions will remove the barrier to minority carrier transport allowing photogenerated minority carriers 356 to be collected with high quantum efficiency. However, in the regions of the photodetector 370 outside the Contact layer 310, that is in regions 329, the energy band diagram of FIG. 4 applies. This region is under the Cap layer 340. FIG. 4 shows the valence-band barrier presented by the Barrier layer 320 will be present because no reverse bias is applied in this region 329. This energy barrier improves the performance of the detector by isolating the Barrier layer 320 free-surface from the bulk Absorber layer 330 in the region 329 under the Cap layer 340. Minority carriers 350 generated in the Absorber layer 330 are blocked by the energy barrier, hence are unavailable to recombine at the surface under the Cap layer 340.

Continuing the description of the invention in FIG. 3B, a typical material for the Barrier layer 320 is $AlAs_xSb_{1-x}$. In one preferred embodiment the Barrier layer 320 comprises $AlAs_xSb_{1-x}$ where X is between 0 and 0.25. In one preferred embodiment the barrier layer 320 comprises a first sublayer of $AlAs_xSb_{1-x}$ where X is between 0 and 0.15 and a second sublayer layer of $Al_yIn_{1-y}As_xSb_{1-x}$ where X is between 0.05 and 0.3 and Y is between 0 and 1. The second sublayer of barrier layer 320 may be doped. Preferably the second sublayer of barrier layer 320 is N type and doped to a concentration substantially between 1.0E14 ($10^{15}$) and 1.0E18 ($10^{18}$) per cm$^3$. The first sublayer of barrier layer 320 is preferably undoped. In an alternative embodiment the first sublayer of barrier layer 320 may be doped N type to a concentration substantially between 1.0E15 and 1.0E18 per cm$^3$. Doping materials, by way of example and not limitation, may be silicon or tellurium.

In an alternative embodiment, the second sublayer of Barrier layer 320 may be doped P type to a concentration substantially between 1.0E16 and 1.0E18 ($10^{18}$) per cm$^3$. Doping materials, by way of example and not limitation, may be beryllium or carbon.

The thicknesses of the Barrier layer 320 may be between 50 nm to 300 nm with 200 nm preferred in one embodiment. The Contact layer 310 thickness may be between 50 nm and 500 nm.

The Absorber layer 330, Barrier layer 320, and Contact layer 310 are semiconductor alloys whose constituents may be chosen from one or more elements chosen from Al, Ga, and In and alloyed with one or more elements chosen from N, P, As, and Sb. In one embodiment, the Absorber layer 330 may comprise $InAs_{0.91}Sb_{0.09}$.

The Absorber layer 330, Barrier layer 320, and Contact layer 310 may be semiconductor alloys whose constituents are chosen from one or more elements chosen from Zn, Cd, and Hg and alloyed with one or more elements chosen from S, Se, and Te.

In particular the Absorber layer 330 may comprise a graded absorber layer as described in U.S. Pat. No. 7,652,252 issued 26 Jan. 2010 titled "Electronically Tunable and Reconfigurable Hyperspectral Photon Detector".

The Absorber layer 330, Contact layer 310 and Barrier layer 320 may be doped N- or P-type.

The Contact layer 310 material is the same as the Absorber layer 330 material, doped to a concentration at least 10 times that of the Absorber layer 330 material. In a preferred embodiment, the Contact layer 310 material is doped to a concentration of 1.0E18 ($10^{18}$) cm$^{-3}$.

In one embodiment, the Cap layer 340 is the same as the Contact layer 310 material. The Cap layer 340 may be doped the same as the Contact layer 310 material. In an alternative embodiment, the Contact layer 310 and Cap layer 340 may be doped differently and may be of different materials although selected from the same materials as described with reference to FIG. 3B above. In addition, while the Contact layer 310 may be formed concurrently with the Cap layer 340, this is not to imply a limitation. In an alternative embodiment, the Cap layer 340 may be formed separately from the Contact layer 310.

The Gap 345 between the Contact layer 310 and the Cap layer 340 is the minimum the particular lithographic process will allow, consistent with acceptable yields. A lower limit to the resolution of the photolithographic process is 0.5 micron. Other known photolithography processes, such as E-Beam lithography, allow a resolution of 20 nanometers. In a preferred embodiment, the Gap 345 between the Contact layer 310 and the Cap layer 340 is between 100 nanometers to 3 microns. The Gap 345 between the Contact layer 310 and Cap layer 340 may be filled with an electrically insulating material 346, or optionally, not filled.

In an alternative embodiment, the wide-bandgap AlAsSb Barrier layer 320, may be replaced or augmented by a narrower-bandgap interfacial Barrier material that can be selected for its favorable valence band offset with respect to the Absorber layer and for its ability to be controllably doped by conventional substitutional doping. Such a material is AlInAsSb.

In an alternative embodiment, the Barrier layer 320 may consist of 3 different layers. These layers may be doped, undoped or compensation doped (to reduce the number of charge carriers below the number present naturally absent any doping). A first Barrier layer 320a is adjacent to the Absorber layer 330 which can be easily doped N-type or P-type to ensure flat band characteristics in the Absorber. This first Barrier layer 320a can optionally have a valence band offset in the case of a P-type Absorber layer 330, or have a conduction band offset in the case of an N-type Absorber. In one embodiment the first Barrier layer 320a comprises $Al_{0.3}In_{0.7}As_{0.7}Sb_{0.3}$ with a band gap of 0.7 eV at 200 degrees K, with a valence band offset with respect to an $InAs_{0.91}Sb_{0.09}$ Absorber layer 330 at 200K of 0.065 eV, 0.4% mismatch in lattice constant with respect to the $InAs_{0.91}Sb_{0.09}$ Absorber layer 330, and a critical first Barrier layer 320a thickness with respect $InAs_{0.91}Sb_{0.09}$ Absorber layer 330 of approximately 30 nm.

The second Barrier layer 320b is adjacent to the first Barrier layer 320a, with a large (>10kT) conduction band offset as compared to the Absorber layer 330, and serves to block the majority carriers in the Absorber layer 330 and the Contact layer 110.

The third Barrier layer 320c which is located between the second Barrier layer 320b and the Contact layer 110, and whose chemical composition is such that it is stable and not prone to oxidation or degradation when exposed to the ambient air, also serves to cap and protect the second Barrier layer 320b. Exemplary materials for the third Barrier layer 320c are Alloys with percentage Aluminum content less than 80%. These third Barrier layers 320c provide better stability to oxygen in the environment as compared to alloys with 100% Al. In an exemplary embodiment, the third Barrier layer 320c material is $Al_{0.7}In_{0.3}As_{0.4}Sb_{0.6}$ with a band gap of 1.5 eV at 200 degrees K, a valence band offset with respect to an $InAs_{0.91}Sb_{0.09}$ Absorber layer 330 at 200K of 0.075 eV, 0.6% mismatch in lattice constant with respect to the $InAs_{0.91}Sb_{0.09}$ Absorber layer 330, and a critical third Barrier layer 320c thickness with respect to the $InAs_{0.91}Sb_{0.09}$ Absorber layer 330 of approximately 15 nm.

The second Barrier layer 320b can be doped or remain undoped. In one embodiment, the second Barrier layer 320b is deliberately doped to a value slightly higher than the background doping of the third Barrier layer 320c. This predictable doping of the second Barrier layer 320b enables one to design the doping level in the first Barrier layer 320a to ensure flat-band conditions in the Absorber layer 330. In one embodiment, the band gap of the third Barrier layer 320c may be smaller than that of the second Barrier layer 320b. In another embodiment, third Barrier layer 320c can optionally have a valence band offset as compared to the Absorber layer 330 or the second Barrier layer 320b, in the case of a P-type Absorber layer 330, or have a conduction band offset in the case of an N-type Absorber layer 330. One or more layers of the compound Barrier layer 320 may be either lattice matched or lattice mismatched and grown to a thickness less than the critical layer thickness in order to prevent the creation of dislocations.

In an alternative embodiment, the absorber layer 330, barrier layer 320, and contact layer 310 are semiconductor alloys whose constituents are chosen from one or more elements chosen from Al, Ga, and In and alloyed with one or more elements chosen from N, P, As, and Sb In an alternative embodiment, the absorber layer 330, barrier layer 320, and contact layer 310 are semiconductor alloys whose constituents are chosen from one or more elements of Zn, Cd, and Hg and alloyed with one or more elements of S, Se, and Te. A preferred alloy comprises HgCdZnSSeTe. In an alternative embodiment, the absorber layer 330, contact layer 310 and barrier layer 320 may be doped N- or P-type.

In particular the absorber layer 530 may comprise a graded absorber layer 330 as described in U.S. Pat. No. 7,652,252 issued 26 Jan. 2010 titled "Electronically Tunable and Reconfigurable Hyperspectral Photon Detector", incorporated herein by reference.

Remaining with FIG. 3B, in an alternative embodiment a Window layer 335 located adjacent to the Absorber layer 330 on the light incidence side of the Absorber layer 330, opposite the Barrier layer 320, may be added. The Window layer 335 is transparent to all wavelengths of light the detector is designed to detect and has an offset in the valence or conduction band compared to the Absorber layer 330 that serves to block minority carriers generated in the Absorber layer 330 from recombining at the light incident surface. The Window layer 335 may comprise InAlAsSb or other materials as long it is transparent to light in the 0.5 micron to 20 micron range. Typical thicknesses of the window layer 335 are on the order of 100 nm. The window layer 335 may comprise the same material as the absorber layer 330 but is heavily doped. For an N doped absorber layer 330 the window layer 335 is N+ doped at a concentration of 1.0E17 to 1.0E18 per $cm^3$. For a P-type absorber layer 330 the window layer 335 is heavily doped P-type with a concentration of 1.0E17 to 1.0E18 per $cm^3$.

FIG. 3A shows a top view of photodetector array 300 of electrostatic Barrier infrared photodetectors 370 where the Contact layer 310 for a pixel covers less than the entire area defining a pixel. A side view of section A-A in FIG. 3A is shown in FIG. 3B. Contact layer 310 occupies less than the entire area of a pixel and is topped with a metal ohmic Contact 305. The lateral region between Contact layers 310 is shown at least partially covered in FIG. 3B by Cap layer 340. Typically, the entire pixel area is not covered by the Contact layer 310. The Barrier layer 320 may be as described previously.

FIG. 3B also illustrates the migration of minority carriers 356 under the Contact layer 310, for example, per the band energy diagram in FIG. 5. The blocking of minority carriers 350 outside the Contact layer 310, under the Cap layer 340, is also shown per FIG. 4.

The band energy diagrams in FIGS. 4 and 5 are for an nBn device. As noted earlier, depending on the materials and doping used for the Contact layer 310, Absorber layer 330 and Barrier layer 320, a pBp device may result. In this embodiment, the principles described above are the same while the polarity or shape of the band energy diagram will change as those skilled in the art know.

FIGS. 6A and 6B show the energy band diagrams for pBp infrared photodetectors comprising the focal plane array. FIG. 6A illustrates in the unbiased case and in regions outside the contact, that the band diagram causes minority carriers 644 to not pass the barrier because the conduction band 612 has an energy barrier. This energy band diagram applies regardless of any reasonable bias voltage on the Contact layer 310. FIG. 6b illustrates the minority carriers 644 under the Contact layer 310 will pass the Barrier while the majority carriers 617 will not pass the Barrier because of the bias voltage on the Contact. In FIGS. 6A and 6B 612 is the conduction band and 615 is the valence band. The majority carriers 617 are holes in pBp infrared photodetectors. The minority carriers 644 are electrons.

In one embodiment shown in FIG. 3B, the detector has a reticulated mesa structure of Contact layers 310 and Cap layers 340 which does not require etching into the Barrier layer 320, and the Barrier layer 320 may comprise one or more layers of differing composition. With this device architecture the Barrier layer 320 remains as a continuous layer across the imaging array. The Absorber layer 330 is likewise continuous, i.e. the entire thickness of the Absorber layer 330 is present across the imaging array. This can result in pixel-to-pixel optical cross talk, since minority carriers generated within a pixel can diffuse to an adjacent pixel and show up as photocurrent in the adjacent pixel. The pixel to pixel cross talk may be reduced by segmenting the device into physically or electrically separate pixels of the array. FIG. 3A shows a photodetector array where etching past the Barrier is not used to define pixels. Etching the Contact layer 310 produces a reticulated pattern in the array of Contact layers 310 and Cap layers 340. Etching is accomplished using an ICP RIE etching machine (inductive copper plasma reactive ion etch) although other methods are possible.

In an alternative embodiment of the principles of the invention, FIGS. 7A and 7B show a cross section of a photodetector array 700 where the Barrier layer 720 may be partially reticulated as in FIG. 7A or fully reticulated as shown in FIG. 7B. The Absorber layer can be either fully or partially reticulated to define pixels (partial Absorber layer reticulation shown is shown in FIG. 7B). The Absorber layer 730 can be fully reticulated to minimize pixel-to-pixel optical cross talk. The reticulated device architecture of FIG. 7B may expose the sidewall 736 of the Absorber layer 730 requiring an appropriate passivation layer (not shown in the figures) to minimize dark current. Passivation layers such as $SiO_2$ or $SiN_x$ or a re-grown semiconductor can be utilized to passivate the sidewall 736 of the reticulated devices. The sidewall angle 737 of the pixel can be engineered to ensure total internal reflection of the incident photons providing 100% optical fill factor, with performance similar to the unreticulated, quasi-planar architecture. A typical range for the sidewall angle 737 is ten to sixty degrees. The optical fill factor is defined as the area or volume of the absorber material for a pixel divided by the area or volume of the absorber of a pixel not etched. Quasi-planar architecture means the Contact layer 310 and Cap layer 340 are substantially planar.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. Other embodiments are within the scope of the claims. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A photodetector with a reduced dark current, comprising:
   an absorber layer of a first area and comprising a first semiconductor;
   a barrier layer of the first area and comprising a second semiconductor disposed on the absorber layer;
   a contact layer with a second area and comprising a third semiconductor disposed on the barrier layer; and
   a cap layer comprising the third semiconductor disposed on the barrier layer with an area approximately equal to the first area less the second area,
   wherein the contact layer is electrically isolated from the cap layer by a dielectric;
   wherein the barrier layer comprises a first sublayer, a second sublayer, and a third sublayer;
   wherein the first sublayer substantially comprises $Al_{0.3}In_{0.7}As_{0.7}Sb_{0.3}$ and is disposed on the absorber layer;
   wherein the second sublayer is disposed on the first sublayer;
   wherein the third sublayer substantially comprises $Al_{0.7}In_{0.3}As_{0.4}Sb_{0.6}$ and is disposed on the second sublayer.

2. The photodetector of claim 1 wherein the first semiconductor, the second semiconductor, and the third semiconductor comprise an alloy of two or more materials selected from the group consisting of Indium, Nitrogen, Phosphorous, Arsenic, Aluminum, Gallium, Antimony, and combinations thereof; and
   wherein the first semiconductor, the second semiconductor, and the third semiconductor may be doped with one or more elements selected from the group consisting of Beryllium, Carbon, Germanium, Selenium, Silicon, Sulfur, Tellurium, and Zinc.

3. The photodetector of claim 1 wherein the first semiconductor comprises InAsSb, and the third semiconductor comprises InAsSb.

4. The photodetector of claim 1 wherein the first semiconductor comprises InAsSb, and the third semiconductor comprises InAsSb.

5. The photodetector of claim 1 wherein the contact layer is separated from the cap layer by less than 3 microns.

6. The photodetector of claim 1 wherein the contact layer is separated from the cap layer by greater than 3 microns.

7. The photodetector of claim 1 wherein the contact layer thickness is such that transport is precluded under a reasonable bias voltage wherein the reasonable bias voltage is any voltage less than that needed to electrically breakdown the barrier layer.

8. The photodetector of claim 1 wherein a cap layer thickness is substantially equal to a contact layer thickness and wherein the contact layer thickness is between 50 nm and 500 nm.

9. A photodetector with a reduced dark current, comprising:
   an absorber layer comprising a first semiconductor;
   a barrier layer comprising a second semiconductor disposed on the absorber layer;
   a contact layer comprising a third semiconductor disposed on a region of the barrier layer; and
   a cap layer comprising the third semiconductor disposed on the barrier layer wherein the contact layer is spaced apart from the cap layer by one hundred nanometers to three microns;
   wherein the contact layer is electrically isolated from the cap layer by a dielectric;
   wherein the barrier layer comprises a first sublayer, a second sublayer, and a third sublayer;
   wherein the first sublayer substantially comprises $Al_{0.3}In_{0.7}As_{0.7}Sb_{0.3}$ and is disposed on the absorber layer;
   wherein the second sublayer is disposed on the first sublayer;

wherein the third sublayer substantially comprises $Al_{0.7}In_{0.3}As_{0.4}Sb_{0.6}$ and is disposed on the second sublayer.

10. The photodetector of claim 9 wherein the first semiconductor, the second semiconductor, and the third semiconductor comprise an alloy of two or more materials selected from the group consisting of Indium, Nitrogen, Phosphorous, Arsenic, Aluminum, Gallium, and Antimony and combinations thereof; and wherein the first semiconductor, the second semiconductor, and the third semiconductor may be doped with one or more elements selected from the group consisting of Beryllium, Carbon, Germanium, Selenium, Silicon, Sulfur, Tellurium, and Zinc.

11. The photodetector of claim 9 wherein the first semiconductor comprises InAsSb, and the third semiconductor comprises InAsSb.

12. The photodetector of claim 9 wherein the first semiconductor comprises InAsSb, and the third semiconductor comprises InAsSb.

13. The photodetector of claim 9 wherein the contact layer is reticulated.

14. The photodetector of claim 13 wherein the barrier layer is reticulated.

15. The photodetector of claim 9 wherein the contact layer thickness is such that transport is precluded under a reasonable bias voltage wherein the reasonable bias voltage is any voltage less than that needed to electrically breakdown the barrier layer, or the contact layer or the absorber layer.

16. The photodetector of claim 9 wherein a cap layer thickness is substantially equal to a contact layer thickness and wherein the contact layer thickness is between 50 nm and 500 nm.

17. A photodetector with a reduced dark current comprising a plurality of pixels wherein each pixel comprises:
- an absorber layer comprising a first semiconductor;
- a barrier layer comprising a second semiconductor disposed on the absorber layer;
- a contact layer comprising a third semiconductor disposed on a region of the barrier layer; and
- a cap layer comprising the third semiconductor disposed on the barrier layer;
- wherein the contact layer and the cap layer are reticulated by gaps between one to three microns;
- wherein the contact layer is electrically isolated from the cap layer by a dielectric;
- wherein the barrier layer comprises a first sublayer, a second sublayer, and a third sublayer;
- wherein the first sublayer substantially comprises $Al_{0.3}In_{0.7}As_{0.7}Sb_{0.3}$ and is disposed on the absorber layer;
- wherein the second sublayer is disposed on the first sublayer;
- wherein the third sublayer substantially comprises $Al_{0.7}In_{0.3}As_{0.4}Sb_{0.6}$ and is disposed on the second sublayer.

18. The photodetector of claim 17 wherein the plurality of pixels are arranged in a plurality of rows and a plurality of columns.

* * * * *